United States Patent [19]

Jones et al.

[11] Patent Number: 4,872,259
[45] Date of Patent: Oct. 10, 1989

[54] ADJUSTABLE FOOTPRINT COMPONENT REMOVAL TOOL

[75] Inventors: Gerald M. Jones, Titusville; Rhonda L. Nemcovsky, Warren, both of Pa.

[73] Assignee: GTE Products Corporation, Stamford, Conn.

[21] Appl. No.: 319,388

[22] Filed: Mar. 3, 1989

[51] Int. Cl.⁴ ............................................. H05K 13/04
[52] U.S. Cl. ........................................ 29/764; 29/739; 29/747
[58] Field of Search ................. 29/764, 762, 747, 739, 29/748, 758, 825, 426.5

[56] References Cited

U.S. PATENT DOCUMENTS 4,615,110 10/1986 Crone ................................ 29/764 X Primary Examiner—Carl E. Hall
Attorney, Agent, or Firm—William H. McNeill

[57] ABSTRACT

An apparatus for removing a friction-fitted, axially aligned electrical component from a printed circuit board, said apparatus comprising: a base; a component removal tool mounted on said base, said tool having a longitudinal axis substantially normal to said base and being mounted for reciprocal movement along said longitudinal axis; a first pair or legs mounted on said base and extending therefrom, said first pair of legs being fixed relative to said base; and a second pair of legs mounted with said base and extending therefrom, said second pair of legs being rotatably adjustable relative to said first pair of legs.

3 Claims, 1 Drawing Sheet

ADJUSTABLE FOOTPRINT COMPONENT REMOVAL TOOL

TECHNICAL FIELD

This invention relates to repair devices and more particularly to devices for repairing component carrying printed circuit boards.

BACKGROUND ART

Printed circuit boards can carry a number of various electrical components including some which can be characterized as being friction fitted. These latter components, e.g., can include press-fit pins of the type shown in U.S. Pat. Nos. 4,759,721; and 4,701,140. Occasionally it is necessary to replace one or more of these pins because of damage. At least one tool, which comprises a driving member movable along a longitudinal axis, is known for this purpose; however, the tool is difficult to hold and position and sometimes damages the printed circuit board.

SUMMARY OF THE INVENTION

It is, therefore, an object of the invention to obviate the disadvantages of the prior art.

It is another object of the invention to enhance the removal and replacement of press-fit pins in printed circuit boards.

The objects are accomplished, in one aspect of the invention, by the provision of an apparatus for removing a press-fit, axially aligned electrical component from a printed circuit board. The apparatus comprises a base having a component removal tool mounted thereon. The tool has a longitudinal axis which is substantially normal to the base and is mounted for reciprocal movement along its longitudinal axis.

The base contains two pairs of legs, one pair of which is fixed and the other being rotatably adjustable.

The adjustable legs, in combination with the fixed legs, allows the apparatus to be positioned advantageously on the printed circuit board; i.e., the removal tool can be positioned over a pin to be removed and the legs can be positioned to avoid interference with other components which are on the board.

Further, by regulating the depth of the stroke of the removal tool relative to the height of the base above the board, it can be insured that the tool will not damage the board.

BEST MODE FOR CARRYING OUT THE INVENTION

Figures 1, 2:
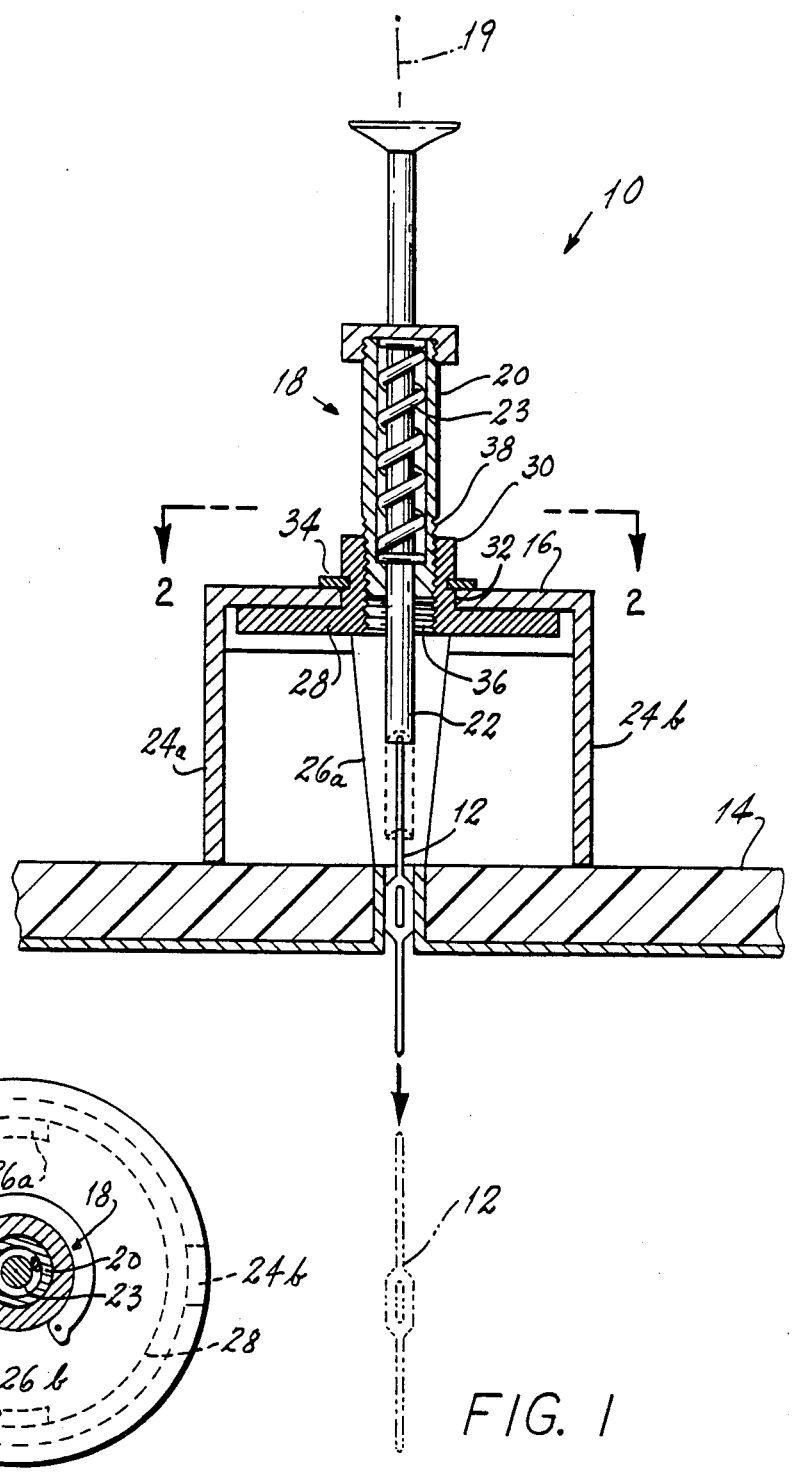
FIG. 1 is a side elevational of the apparatus of the invention, partially in section.
FIG. 2 is a sectional view taken along the line 2—2 of FIG. 1.

For a better understanding of the present invention, together with other and further objects, advantages and capabilities thereof, reference is made to the following disclosure and appended claims taken in conjunction with the above-described drawings.

Referring now to the invention with greater particularity, there is shown in FIG. 1 an apparatus 10 for removing a friction-fitted, axially aligned electrical component such as press-fit pin 12 from a printed circuit board 14.

The apparatus 10 has a base 16 which mounts a component removal tool 18. The tool has a longitudinal axis 19 substantially normal to base 16 and includes a body 20 containing therein a driver 22, loaded by spring 23, which is mounted for reciprocal movement along the longitudinal axis 19.

Legs 24a and 24b are mounted on the base 16 and extended therefrom to form a first set which is fixed relative to the base 16. The legs 24a and 24b are preferably diametrically opposed to one another.

Legs 26a and 26b are mounted upon a rotatable table 28 which is mounted with base 16 via an upstanding boss 30 which projects through an aperture 32 in base 16. The legs 26a and 26b are diametrically opposed to one another and form a second set. A "C" ring clamp 34 engages a notch in the boss 30 to maintain the rotatable table in position. Further, in the embodiment shown, the boss 30 has a threaded bore 36 which mounts the threaded end 38 of removal tool 18; however, it is is to be understood that other mounting means can be employed.

In operation, the apparatus 10 is positioned over a component 12 to be removed, with the legs 24a,b and 26a,b, having their feet resting on circuit board 14. To avoid interference caused by other components on the board, the fixed legs 24a,b are positioned to rest on the board and the rotatable legs 26a, b are adjusted, by rotating the table 28, until they, too, are able to rest on the board 14 without interfering with other components. With the four legs now resting firmly on the board, and the removal tool 18 longitudinally aligned with a component 12, the driver 22 is actuated, as by a sharp blow with a mallet, to drive component 12 from the board. By properly ascertaining the depth of movement of driver 22 and the height of the legs 24, 26, it can be insured that the driver 22 does not contact the board 14, thus avoiding damage thereto.

This apparatus obviates the disadvantages of the prior art and provides a simple and expedient component removal device.

While there have been shown and described what are at present considered to be the preferred embodiments of the invention, it will be apparent to those skilled in the art that various changes and modifications can be made herein without departing from the scope of the invention as defined by the appended claims.

We claim:

1. An apparatus for removing a friction-fitted, axially aligned electrical component from a printed circuit board, said apparatus comprising:
   a base;
   a component removal tool mounted on said base, said tool having a longitudinal axis substantially normal to said base and being mounted for reciprocal movement along said longitudinal axis;
   a first pair or legs mounted on said base and extending therefrom, said first pair of legs being fixed relative to said base; and
   a second pair of legs mounted with said base and extending therefrom, said second pair of legs being rotatably adjustable relative to said first pair of legs, both said first and second pair of legs engaging said board during the removing of an electrical component therefrom.

2. The apparatus of claim 1 wherein the individual legs of said first pair of legs are diametrically opposed to one another.

3. The apparatus of claim 2 wherein the individual legs of said second pair of legs are diametrically opposed to one another.

* * * * *